United States Patent
Jo et al.

(10) Patent No.: US 11,387,556 B2
(45) Date of Patent: Jul. 12, 2022

(54) FRONTEND MODULE

(71) Applicant: SAMSUNG ELECTRO-MECHANICS CO., LTD., Suwon-si (KR)

(72) Inventors: Kang Ta Jo, Suwon-si (KR); Seong Jong Cheon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 312 days.

(21) Appl. No.: 16/670,636

(22) Filed: Oct. 31, 2019

(65) Prior Publication Data

US 2020/0321698 A1   Oct. 8, 2020

(30) Foreign Application Priority Data

Apr. 5, 2019   (KR) .................. 10-2019-0039982
Jun. 20, 2019   (KR) .................. 10-2019-0073503

(51) Int. Cl.
*H04L 5/14* (2006.01)
*H01Q 5/307* (2015.01)
(Continued)

(52) U.S. Cl.
CPC .......... *H01Q 5/307* (2015.01); *H03H 7/0115* (2013.01); *H03H 7/38* (2013.01); *H03H 7/463* (2013.01); *H04L 5/14* (2013.01); *H04W 84/12* (2013.01)

(58) Field of Classification Search
CPC .......... H04B 1/0057; H04B 1/40; H04B 1/48; H03H 7/0115; H03H 7/1758; H03H 7/1766; H03H 7/38; H03H 7/463; H04L 5/14; H01L 24/73; H01L 2224/32225; H01L 2224/48227; H01L 2224/73265; H01L 2924/1461; H01L 2924/19105;
(Continued)

(56) References Cited

U.S. PATENT DOCUMENTS 10,257,119 B2 * 4/2019 Wloczysiak ......... H04B 1/0057
10,587,292 B2 * 3/2020 Elbrecht ................. H04B 1/48
(Continued)

FOREIGN PATENT DOCUMENTS

CN   101662267 A   3/2010
CN   102801401 A   11/2012
(Continued)

OTHER PUBLICATIONS

Walsh et al., 5G New Radio Solutions: Revolutionary Applications Here Sooner Than You Think, SKYWORKS, 16 pages, 2018.*
(Continued)

*Primary Examiner* — Frank Duong
(74) *Attorney, Agent, or Firm* — NSIP Law

(57) ABSTRACT

A frontend module includes an antenna terminal, and a duplexer including a first filter connected to the antenna terminal and a first terminal, configured to perform cellular communications within a 3.3 GHz to 4.2 GHz band, and a second filter connected to the antenna terminal and a second terminal, configured to perform Wi-Fi communications within a 5.15 GHz to 5.950 GHz band, wherein each of the first filter and the second filter includes an LC filter, and a portion of an operating time period of the first filter overlaps a portion of an operating time period of the second filter.

19 Claims, 5 Drawing Sheets

(51) Int. Cl.
  *H03H 7/46* (2006.01)
  *H04W 84/12* (2009.01)
  *H03H 7/01* (2006.01)
  *H03H 7/38* (2006.01)

(58) Field of Classification Search
  CPC ... H01L 2924/30107; H01L 2924/3011; H01L 2924/3025; H01Q 5/307; H04W 84/12
  See application file for complete search history.

(56) References Cited

U.S. PATENT DOCUMENTS

| | | | |
|---|---|---|---|
| 10,587,329 B2 * | 3/2020 | Maldonado | H04B 1/44 |
| 10,608,677 B2 * | 3/2020 | Shinozaki | H04B 1/0057 |
| 10,637,518 B2 * | 4/2020 | Tseng | H04B 1/525 |
| 10,700,715 B2 * | 6/2020 | Takada | H04B 1/48 |
| 10,848,126 B2 * | 11/2020 | Alicioglu | H04B 1/1036 |
| 10,965,021 B2 * | 3/2021 | Wloczysiak | H04B 1/18 |
| 10,979,025 B2 * | 4/2021 | Houlden | H03H 9/175 |
| 2006/0055485 A1 | 3/2006 | Lobeek | |
| 2010/0052813 A1 | 3/2010 | Okabe | |
| 2012/0300679 A1 | 11/2012 | Tsutsumi | |
| 2018/0234079 A1 | 8/2018 | Takamine et al. | |
| 2020/0304167 A1 * | 9/2020 | Kwon | H04B 1/0057 |
| 2020/0328729 A1 * | 10/2020 | Jo | H04B 1/18 |
| 2020/0395917 A1 * | 12/2020 | Morote | H03H 9/0296 |
| 2021/0104996 A1 * | 4/2021 | Mori | H04B 1/18 |

FOREIGN PATENT DOCUMENTS

| | | |
|---|---|---|
| CN | 103597744 A | 2/2014 |
| KR | 10-1999-0058243 A | 7/1999 |
| KR | 10-2005-0075433 A | 7/2005 |
| KR | 10-2018-0093795 A | 8/2018 |
| KR | 10-2018-0121075 A | 11/2018 |
| TW | 201724735 A | 7/2017 |
| WO | WO 2018/044916 A1 | 3/2013 |
| WO | WO 2017/110723 A1 | 6/2017 |

OTHER PUBLICATIONS

Chinese Office Action dated Jul. 6, 2021, in counterpart Chinese Patent Application No. 202010009298.8 (9 pages in English and 6 pages in Chinese).
Korean Office Action dated Sep. 8, 2020 in counterpart Korean Patent Application No. 10-2019-0073503 (6 pages in English, 5 pages in Korean).
Detomasi, Sheri. "Coexistence Issues: Coming to 5G New Radio." *EDN Asia*, Aug. 7, 2018, www.ednasia.com/news/article/Coexistence-issues-Coming-to-5G-New-Radio. (2 pages, in English).

* cited by examiner

FRONTEND MODULE

CROSS-REFERENCE TO RELATED APPLICATIONS

This application claims the benefit under 35 USC 119(a) of Korean Patent Application No. 10-2019-0039982 filed on Apr. 5, 2019 and Korean Patent Application No. 10-2019-0073503 filed on Jun. 20, 2019 in the Korean Intellectual Property Office, the entire disclosures of which are incorporated herein by reference for all purposes.

BACKGROUND

1. Field

The following description relates to a frontend module.

2. Description of Related Art

Fifth generation (5G) communications are expected to connect more devices to each other efficiently with larger amounts of data and faster data transfer rates, as compared to conventional long-term evolution (LTE) communications.

5G communications are developing towards using a frequency band of 24,250 MHz to 52,600 MHz, corresponding to a millimeter wave (mmWave) band, and a frequency band of 450 MHz to 6,000 MHz, corresponding to a sub-6 GHz band.

Each of the n77 band (3,300 MHz to 4,200 MHz), the n78 band (3,300 MHz to 3,800 MHz), and the n79 band (4,400 MHz to 5,000 MHz) is defined as one band from among sub-6 GHz operating bands, and the n77 band, the n78 band, and the n79 band are expected to be used as main bands, due to the advantages of having wide bandwidths for use as main bands.

In the sub-6 GHz band, a 4*4 Multi-Input/Multi-Output (MIMO) system is basically applied as a way to improve frequency efficiency. MIMO is a technique in which bandwidth may increase in proportion to the number of antennas. In an example in which four antennas are used, four times the frequency efficiency of a single antenna may be obtained, accordingly. However, because of the slimming and miniaturization of mobile devices, there is a limitation of the space in which an antenna may be mounted. Additional physical limitations may be present when implementing four antennas in a terminal, under the conditions presented for antennas used in an existing system.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a frontend module includes an antenna terminal, and a duplexer including a first filter connected to the antenna terminal and a first terminal, configured to perform cellular communications within a 3.3 GHz to 4.2 GHz band, and a second filter connected to the antenna terminal and a second terminal, configured to perform Wi-Fi communications within a 5.15 GHz to 5.950 GHz band, wherein each of the first filter and the second filter includes an LC filter, and a portion of an operating time period of the first filter overlaps a portion of an operating time period of the second filter.

The frontend module may further include an impedance matching component configured to match an impedance of a passband of the first filter and an impedance of a passband of the second filter.

The impedance matching component may include a matching inductor disposed between the antenna terminal and a ground.

The first filter may include series connected components connected between the antenna terminal and the first terminal in series, and shunt connected components, each disposed between a ground and a node of different nodes between the antenna terminal and the first terminal.

One series connected component from among the series connected components may include a capacitor and an inductor connected to each other in parallel, configured to form an attenuation pole at 5.90 GHz to 6.0 GHz, and another series connected component from among the series connected components may include a capacitor and an inductor connected to each other in parallel, configured to form an attenuation pole at 2.25 GHz to 2.35 GHz.

The one series connected component from among the series connected components may be configured to form an attenuation pole at 5.95 GHz, and the other series connected component from among the series connected components may be configured to form an attenuation pole at 2.3 GHz.

A first shunt connected component from among the shunt connected components may include a capacitor and an inductor connected to each other in series, configured to form an attenuation pole at 1.95 GHz to 2.05 GHz, a second shunt connected component from among the shunt connected components may include a capacitor and an inductor connected to each other in series, configured to form an attenuation pole at 2.64 GHz to 2.74 GHz, and a third shunt connected component from among the shunt connected components may include a capacitor and an inductor connected to each other in series, configured to form an attenuation pole at 5.10 GHz to 5.20 GHz.

The first shunt connected component may be configured to form an attenuation pole at 2 GHz, the second shunt connected component may be configured to form an attenuation pole at 2.69 GHz, and the third shunt connected component may be configured to form an attenuation pole at 5.15 GHz.

The second filter may include series connected components connected between the antenna terminal and the second terminal in series, and shunt connected components, each disposed between a ground and a node of different nodes between the antenna terminal and the second terminal.

One shunt connected component from among the shunt connected components may include a capacitor and an inductor connected to each other in series, and may be configured to form an attenuation pole at 4.15 GHz to 4.25 GHz, and another shunt connected component from among the shunt connected components may include a capacitor and an inductor connected to each other in series, and may be configured to form an attenuation pole at 3.70 GHz to 3.80 GHz.

The one shunt connected component may be configured to form an attenuation pole at 4.20 GHz, and the other shunt connected component may be configured to form an attenuation pole at 3.75 GHz.

The frontend module may further include a third filter having a passband of a 4.4 GHz to 5.0 GHz band, and a switch configured to selectively connect the duplexer and the third filter to the antenna terminal.

The frontend module may further include a fourth filter having a passband of a 2.4 GHz to 2.4835 GHz band, wherein the fourth filter may be connected to an antenna terminal that is different from the antenna terminal to which the duplexer is connected.

In another general aspect, a frontend module includes an antenna terminal, and a duplexer including a first filter connected to the antenna terminal, and a second filter configured to perform radio communications of a standard different from a standard supported by the first filter in a frequency band different from a frequency band of the first filter, wherein each of the first filter and the second filter includes an LC filter, and a portion of an operating time period of the first filter overlaps a portion of an operating time period of the second filter.

The first filter may be configured to support cellular communications in a 3.3 GHz to 4.2 GHz band, and the second filter may be configured to support Wi-Fi communications in a 5.15 GHz to 5.950 GHz band.

The first filter and the second filter may each have an attenuation characteristic of 35 dB or more.

In another general aspect, a frontend module includes an antenna terminal, and a duplexer including a first filter connected to the antenna terminal and a first terminal, configured to perform cellular communications, and a second filter connected to the antenna terminal and a second terminal, configured to perform Wi-Fi communications, wherein each of the first filter and the second filter includes an LC filter, and a portion of an operating time period of the first filter overlaps a portion of an operating time period of the second filter.

The first filter may be configured to support the cellular communications within a 3.3 GHz to 4.2 GHz band, and the second filter may be configured to support the Wi-Fi communications within a 5.15 GHz to 5.950 GHz band.

The first filter and the second filter may each have an attenuation characteristic of 35 dB or more.

The frontend module may further include an impedance matching component configured to match an impedance of a passband of the first filter and an impedance of a passband of the second filter.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
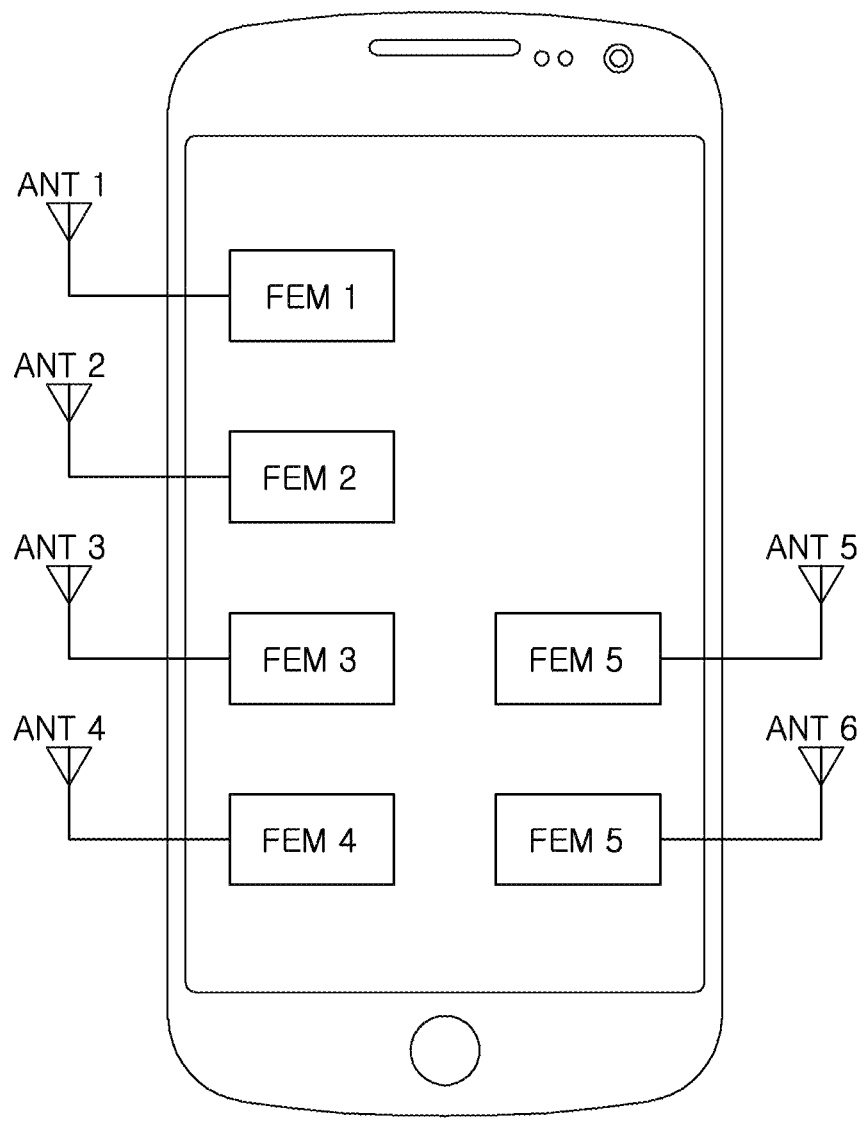
FIG. 1 is a block diagram illustrating a mobile device on which a frontend module according to an example is mounted.

The following detailed description of the present disclosure refers to the accompanying drawings, which illustrate, as an example, specific embodiments in which the present disclosure may be practiced. These embodiments may be described in sufficient detail to enable those skilled in the art to practice the present disclosure. It should be understood that the various embodiments of the present disclosure are different, but do not need to be mutually exclusive. For example, certain shapes, structures, and characteristics described herein may be implemented in other embodiments without departing from the spirit and scope of the present disclosure in connection with an embodiment. It should be also understood that position or arrangement of the individual components within each disclosed embodiment may be varied without departing from the spirit and scope of the present disclosure. The following detailed description is, therefore, not to be taken in a limiting sense, and the scope of the present disclosure is limited only by the appended claims, along with the full scope of equivalents to which such claims are entitled, if properly explained. In the drawings, like reference numerals refer to the same or similar functions throughout the several views.

Hereinafter, examples will be described in detail with reference to the accompanying drawings such that those skilled in the art may easily carry out the present examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

FIG. 1 is a block diagram illustrating a mobile device on which a frontend module according to an example is mounted.

Referring to the example of FIG. 1, a mobile device 1 according to an example may include a plurality of antennas ANT1 to ANT6, and a plurality of frontend modules FEM1 to FEM6, respectively connected to different antennas from among the plurality of antennas ANT1 to ANT6.

The mobile device 1 may perform a plurality of standard wireless communications tasks such as cellular (LTE/WCDMA/GSM) communications, Wi-Fi communications of 2.4 GHz and 5 GHz, Bluetooth communications, and other related wireless communications tasks. The plurality of antennas ANT1 to ANT6 and the plurality of frontend modules FEM1 to FEM6, included in the mobile device, may be used to support the plurality of standard wireless communications tasks.

When the plurality of antennas are implemented in a limited space available in a mobile device, RF signals input/output to/from the plurality of antennas may interfere with each other, causing a problem of the occurrence of performance deterioration.

Therefore, it may be valuable to support a plurality of standard wireless communications tasks by having the frontend module connected to a single antenna, to reduce or minimize the number of antennas mounted on the mobile device 1.

Figure 2:
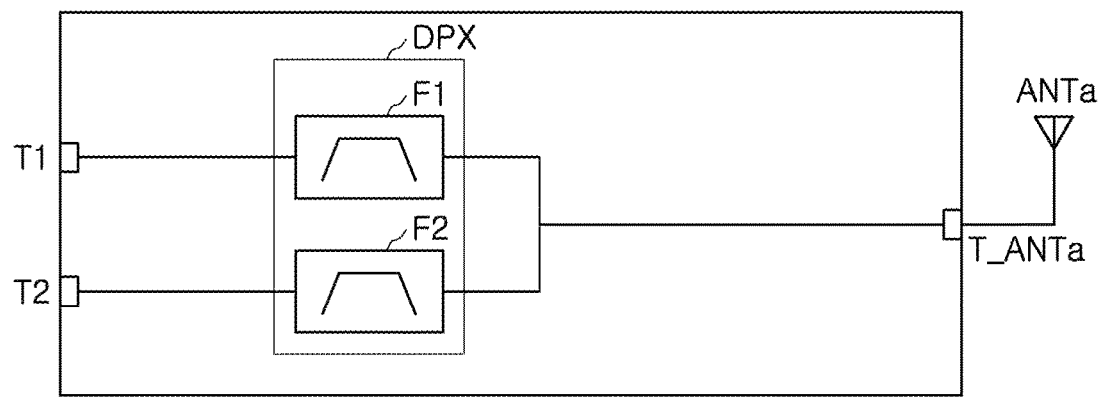
FIG. 2 is a block diagram of a frontend module according to an example.

FIG. 2 is a block diagram of a frontend module according to an example.

A frontend module according to an example may include a first antenna terminal T_ANTa, a first terminal T1, a second terminal T2, and a duplexer DPX including both of a first filter F1 and a second filter F2.

The first filter F1 may be disposed between the first antenna terminal T_ANTa and the first terminal T1. In such an example, one end of the first filter F1 may be connected to the first antenna terminal T_ANTa, and the other end of the first filter F1 may be connected to the first terminal T1.

Further, the second filter F2 may be disposed between the first antenna terminal T_ANTa and the second terminal T2. One end of the second filter F2 may be connected to the first antenna terminal T_ANTa, and the other end of the second filter F2 may be connected to the second terminal T2. In such an example, the second filter F2 may support wireless communications using a standard different from a standard supported by the first filter F1 and also performed in a frequency band different from a frequency band of the first filter F1.

The first filter F1 may support cellular communications in a predetermined first frequency band chosen from frequency bands among a group of sub-6 GHz bands. For example, the first filter F1 may support cellular communications in the 3.3 GHz to 4.2 GHz band (the n77 band), to correspond to the first frequency band. According to another example, the first filter F1 may support cellular communications in the 3.3 GHz to 3.8 GHz band (the n78 band).

The first filter F1 may operate as a band-pass filter. For example, the first filter F1 may include a band-pass filter having a passband of the 3.3 GHz to 4.2 GHz band. Accordingly, such a band-pass filter may have a lower limit frequency of 3.3 GHz and an upper limit frequency of 4.2 GHz. According to another example, the first filter F1 may include a band-pass filter having a passband of the 3.3 GHz to 3.8 GHz band. Accordingly, such a band-pass filter may have a lower limit frequency of 3.3 GHz and an upper limit frequency of 3.8 GHz.

The second filter F2 may support Wi-Fi communications occurring in a 5 GHz band. As an example, the second filter F2 may support Wi-Fi communications in the 5.15 GHz to 5.950 GHz band.

The second filter F2 may operate as a band-pass filter. For example, the second filter F2 may include a band-pass filter having a passband of the 5.15 GHz to 5.950 GHz band. Thus, the band-pass filter has a lower limit frequency of 5.15 GHz and an upper limit frequency of 5.950 GHz.

According to an example, the first filter F1 supporting cellular communications in the sub-6 GHz band and the second filter F2 supporting Wi-Fi communications in the 5 GHz band may be configured to form a single duplexer DPX. The first filter F1 and the second filter F2 may connect the duplexer DPX to the one first antenna ANTa, to thereby drastically minimize the number of antennas provided in the mobile device 1. A portion of the operating time period of the first filter F1 provided in the one duplexer DPX may overlap a portion of the operating time period of the second filter F2. For example, the operating time period of the first filter F1 may coincide with the operating time period of the second filter F2, and the first antenna ANTa may simultaneously perform an external device, cellular communications, and Wi-Fi communications, due to this overlapping operation of the first filter F1 and the second filter F2.

According to an example, the number of antennas provided in a mobile device may be reduced compared to previous approaches, and may minimize or prevent RF signals output from different antennas from interfering with each other. Therefore, communications performance of the mobile device may be improved accordingly compared to previous approaches. Furthermore, filters supporting different standards may be integrated into one frontend module to thereby reduce the overall area of the frontend module compared to previous approaches.

Referring to the example of FIG. 2, because the first filter F1 for supporting cellular communications in the sub-6 GHz band and the second filter F2 for supporting Wi-Fi communications in the 5 GHz band share one antenna, a relatively high attenuation characteristic may be implemented in such an example, as compared with an example in which different filters are connected to different antennas.

For example, in an example the first filter F1 and the second filter F2 may each have an attenuation characteristic of 25 dB, with the first filter F1 supporting cellular communications in the sub-6 GHz band and the second filter F2 supporting Wi-Fi communications in the 5 GHz band are connected to separate antennas. In this example, when the first filter F1 and the second filter F2 are connected to one shared antenna, because an additional 10 dB antenna isolation characteristic may be implemented, each of the first filter F1 and the second filter F2 may have a total attenuation characteristic of 35 dB or more.

Although a bulk acoustic wave (BAW) filter has excellent attenuation characteristics, the BAW filter may not easily be applied to the fifth-generation (5G) communications under consideration. 5G communications require broadband frequency characteristics, and it may be difficult to form a relatively wide passband using a BAW filter. Therefore, in order to satisfy the broadband frequency characteristics used in 5G communications, the filters may each be provided as an LC filter, implemented as a combination of a capacitor and an inductor that together act as a filter.

Figure 3:
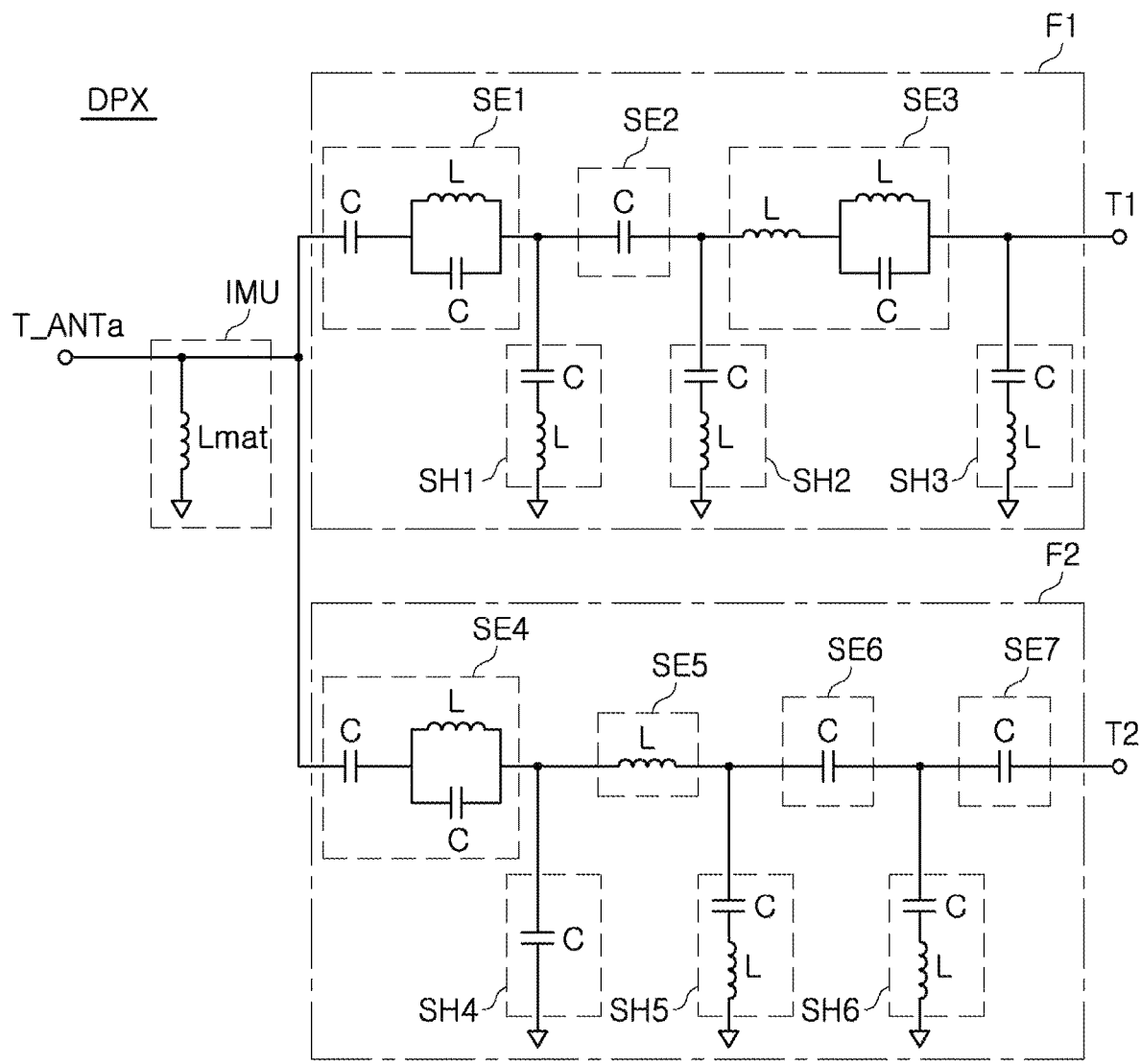
FIG. 3 is a circuit diagram of a duplexer according to an example.

FIG. 3 is a circuit diagram of a duplexer according to an example.

Referring to the example of FIG. 3, a duplexer DPX may include a first filter F1, a second filter F2, and an impedance matching unit IMU. The impedance matching unit IMU may also be referred to as an impedance matching component.

Each of the first filter F1 and the second filter F2 may include an LC filter implemented as a combination of a capacitor and an inductor. For example, each of the first filter F1 and the second filter F2 may include an LC filter that has an attenuation characteristic of 35 dB or more. In general, each of the first filter F1 and the second filter F2 may include a number of series units and shunt units, each of the series units and shunt units also being referred to as series connected components and shunt connected components. Such series connected components and shunt connected components, as discussed below in further detail, are formed using various arrangements of various passive elements, such as inductors and capacitors.

The first filter F1 may include a plurality of series units SE1 to SE3 arranged in series between a first antenna terminal T_ANTa and a first terminal T1. The first filter F1 may also include a plurality of shunt units SH1 to SH3 arranged between a ground and different nodes between the first antenna terminal T_ANTa and the first terminal T1.

For example, the plurality of series units SE1 to SE3 may include a first series unit SE1, a second series unit SE2, and a third series unit SE3, sequentially arranged between the first antenna terminal T_ANTa and the first terminal T1. The plurality of shunt units SH1 to SH3 may include a first shunt unit SH1 disposed between a ground and a node between the first series unit SE1 and the second series unit SE2, a second shunt unit SH2 disposed between a ground and a node between the second series unit SE2 and the third series unit SE3, and a third shunt unit SH3 disposed between a ground and a node between the third series unit SE3 and the first terminal T1.

The first series unit SE1 may include a capacitor C and an inductor L connected to each other in parallel, and another capacitor C connected to the capacitor C and the inductor L, connected to each other in parallel, in series.

The second series unit SE2 may include a capacitor C, and the third series unit SE3 may include a capacitor C and an inductor L connected to each other in parallel, and another inductor L connected to the capacitor C and the inductor L, connected to each other in parallel, all in series.

Each of the first shunt unit SH1, the second shunt unit SH2, and the third shunt unit SH3 may include a capacitor C and an inductor L, connected to each other in series.

The capacitors C and the inductors L, connected to each other in parallel, in the first series unit SE1 and the third series unit SE3, may form an attenuation pole by acting to provide parallel resonance. The first series unit SE1 may accordingly form an attenuation pole at 5.90 GHz to 6.0 GHz, e.g., specifically at about 5.95 GHz. The third series unit SE3 may accordingly form an attenuation pole at 2.25 GHz to 2.35 GHz, e.g., specifically at about 2.3 GHz.

According to an example, the first filter F1 may improve attenuation characteristics with a relatively high frequency band (Wi-Fi 5 GHz high) from among the Wi-Fi 5 GHz band, in accordance with the attenuation pole formed at about 5.95 GHz by the first series unit SE1, and may improve attenuation characteristics with respect to a relatively low frequency band (LTE HB low) from among the LTE high band (HB), in accordance with the attenuation pole formed at about 2.3 GHz by the third series unit SE3.

The capacitor C and the inductor L provided in the first shunt unit SH1, the second shunt unit SH2, and the third shunt unit SH3 may form an attenuation pole by series resonance. For example, the first shunt unit SH1 may form an attenuation pole at 1.95 GHz to 2.05 GHz, for example, about 2 GHz, the second shunt unit SH2 may form an attenuation pole at 2.64 GHz to 2.74 GHz, for example, about 2.69 GHz, and the third shunt unit SH3 may form an attenuation pole at about 5.10 GHz to about 5.20 GHz, for example, about 5.15 GHz.

According to an example, the first filter F1 may improve attenuation characteristics with a 1.7 GHz to 2.0 GHz band (LTE MB) in accordance with the attenuation pole formed in a band of about 2 GHz by the first shunt unit SH1, may improve attenuation characteristics with a relatively high frequency band (LTE HB high) among the 2.3 GHz to 2.7 GHz band (LTE HB) in accordance with the attenuation pole formed at about 2.69 GHz by the second shunt unit SH2, and may improve attenuation characteristic with a relatively low frequency band (Wi-Fi 5 GHz low) from among the Wi-Fi 5 GHz band in accordance with the attenuation pole formed at about 5.15 GHz by the third shunt unit SH3.

The second filter F2 may include a plurality of series units SE4 to SE7 arranged in series between the first antenna terminal T_ANTa and a second terminal T2, and a plurality of shunt units SH4 to SH6 arranged between a ground and different nodes between the first antenna terminal T_ANTa and the second terminal T2.

For example, the plurality of series units SE4 to SE7 may include a fourth series unit SE4, a fifth series unit SE5, a sixth series unit SE6, and seventh series unit SE7. The plurality of series units SE4 to SE7 may be sequentially arranged between the first antenna terminal T_ANTa and the second terminal T2. The plurality of shunt units SH4 to SH6 may include a fourth shunt unit SH4 disposed between a ground and a node between the fourth series unit SE4 and the fifth series unit SE5, a fifth shunt unit SH5 disposed between a ground and a node between the fifth series unit SE5 and the sixth series unit SE6, and a sixth shunt unit SH6 disposed between a ground and a node between the sixth series unit SE6 and the seventh series unit SE7.

The fourth series unit SE4 may include a capacitor C and an inductor L connected to each other in parallel, and a capacitor C connected to the capacitor C and the inductor L, connected to each other in parallel, in series. The fifth series unit SE5 may include an inductor L. Each of the sixth series unit SE6 and the seventh series unit SE7 may include a capacitor C.

The fourth shunt unit SH4 may include a capacitor C. Each of the fifth shunt unit SH5 and the sixth shunt unit SH6 may include a capacitor C and an inductor L connected to each other in series.

According to an example, the capacitor C and the inductor L connected to each other in parallel in the fourth series unit SE4 may implement a second high-frequency attenuation characteristic in an 11 GHz band.

The capacitors C and the inductors L provided in each of the fifth shunt unit SH5 and the sixth shunt unit SH6 may form an attenuation pole by series resonance. The fifth shunt unit SH5 may form an attenuation pole at 4.15 GHz to 4.25 GHz, specifically about 4.2 GHz. The sixth shunt unit SH6 may form an attenuation pole at 3.70 GHz to 3.80 GHz, specifically about 3.75 GHz.

According to an example, the second filter F2 may improve attenuation characteristics for a relatively high frequency band (n77 high) among the n77 band in accordance with the attenuation pole formed in an about 4.20 GHz band by the fifth shunt unit SH5, and may improve attenuation characteristics for a relatively intermediate frequency band (n77 mid) among the n77 band in accordance with the attenuation pole formed in a band of about 3.75 GHz by the sixth shunt unit SH6.

In order to realize the first filter F1 and the second filter F2 by using the one duplexer DPX, an impedance of the passband of the first filter F1 and an impedance of the passband of the second filter F2 may be matched.

According to an example, the impedance matching unit IMU may be provided between the first antenna terminal T_ANTa and the first filter F1 and the second filter F2. Accordingly, impedances of the passband of each of the first filter F1 and the second filters F2 may be matched. The impedance matching unit IMU may be disposed between a ground and a node connected to the first antenna terminal T_ANTa, the first filter F1, and the second filter F2, respectively.

The impedance matching unit IMU may include a matching inductor Lmat disposed between the first antenna terminal T_ANTa and the ground. For example, the matching inductor Lmat may match impedances of the passband of each of the first filter F1 and the second filter F2, to be 50 ohms each.

In an example in which a phase shifter in which a plurality of elements are arranged in a π shape or a T shape is employed as the impedance matching unit, there may be a disadvantage that the signal loss increases, as the number of elements for matching impedance increases. In particular, signal loss tends to occur even more so in an example in which elements are placed in a signal path.

According to an example, instead of being directly arranged in the signal path, the matching inductor Lmat for matching impedance may be disposed between the first antenna terminal T_ANTa and the ground to be greatly advantageous in terms of the signal loss.

Figure 4:
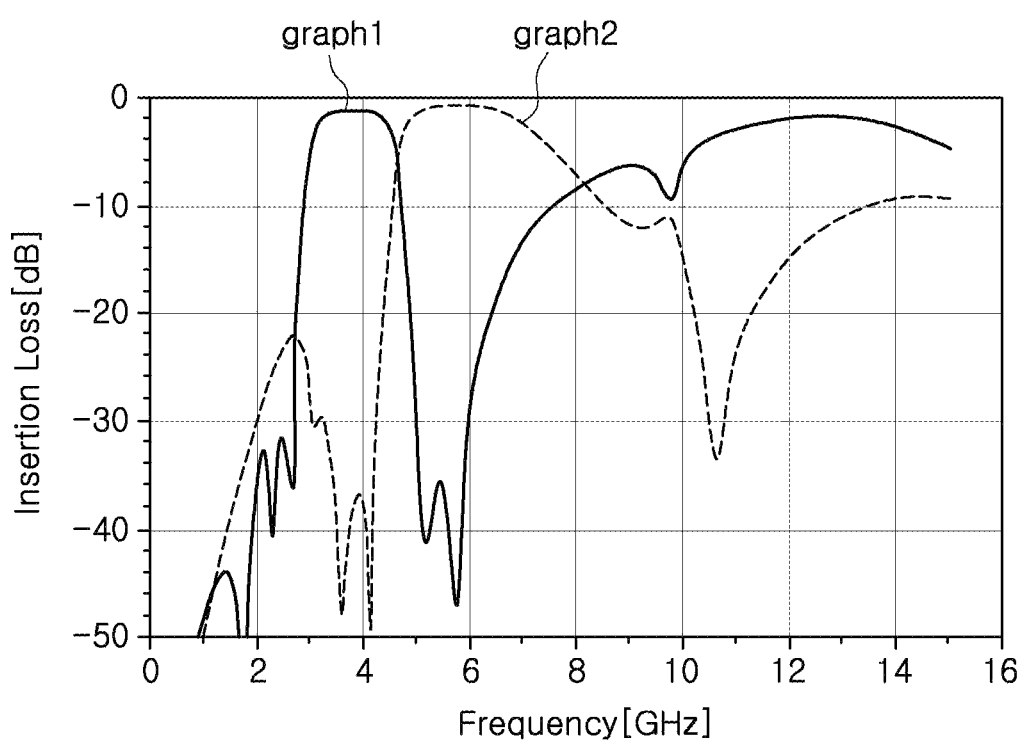
FIG. 4 illustrates a frequency response according to an example.

FIG. 4 illustrates a frequency response according to an example.

In the example of FIG. 4, a first graph, or graph 1, represents a frequency response of a first filter F1, and a second graph, or graph 2, represents a frequency response of a second filter F2.

Referring to the first graph, or graph 1, of the example of FIG. 4, the frequency response of the first filter F1 may have a pass characteristic of about −1.53 dB at about 3.3 GHz and a pass characteristic of about −1.30 dB at about 4.20 GHz. Thus, the first filter F1 may have a relatively high attenuation characteristic for the 2.300 GHz to 2.690 GHz band assigned to the LTE communications band, and may also have a relatively high attenuation characteristic for the 5.15 GHz to 5.950 GHz band assigned to the Wi-Fi communications band.

Referring to the second graph, or graph 2, of the example of FIG. 4, the frequency response of the second filter F2 may have a pass characteristic of about −0.97 dB at about 5.15 GHz, and may also have a pass characteristic of about −0.66 dB at about 5.95 GHz. Accordingly, the second filter F2 may have a relatively high attenuation characteristic for the 3.3 GHz to 4.2 GHz band assigned to the sub-6 GHz band.

According to an example, the first filter F1 may have an attenuation characteristic of about −39.05 dB at 5.15 GHz. The second filter F2 may have an attenuation characteristic of about −36.95 dB at 4.2 GHz. Therefore, even when the first filter F1 and the second filter F2 share a single antenna, it is possible to transmit and receive RF signals stably without interference, because of these relatively high attenuation characteristics.

According to an example, because filters having relatively high attenuation characteristics may be implemented by using a duplexer, such an example may be greatly advantageous in terms of signal loss, as compared with a case in which a separate diplexer is provided in addition to filters. By using such an integrated duplexer, an area of the module may be reduced, and the manufacturing cost may be reduced as well.

Figure 5:
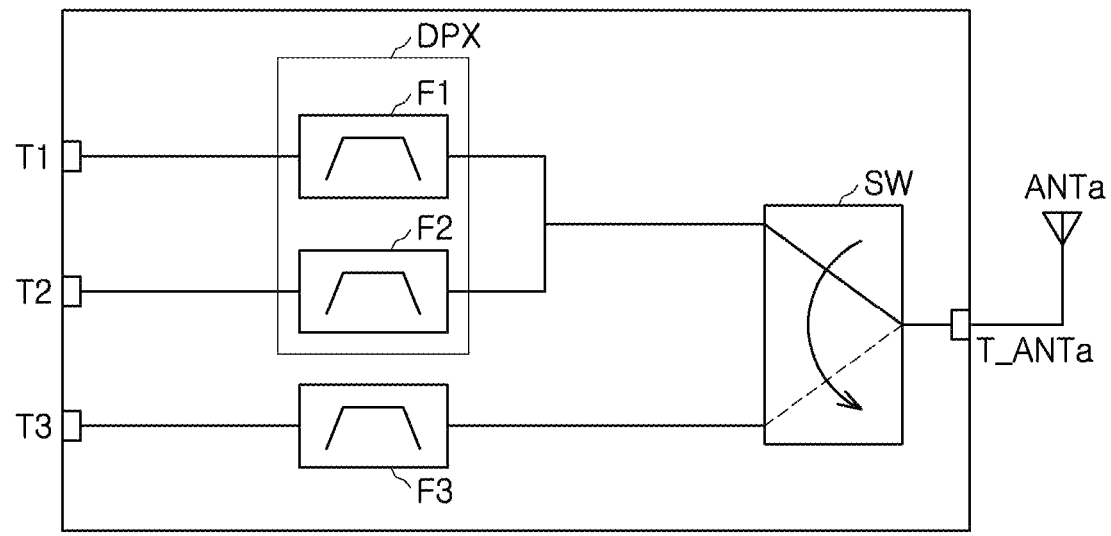
FIGS. 5 to 7 are block diagrams of frontend modules according to various examples.
Figure 6:
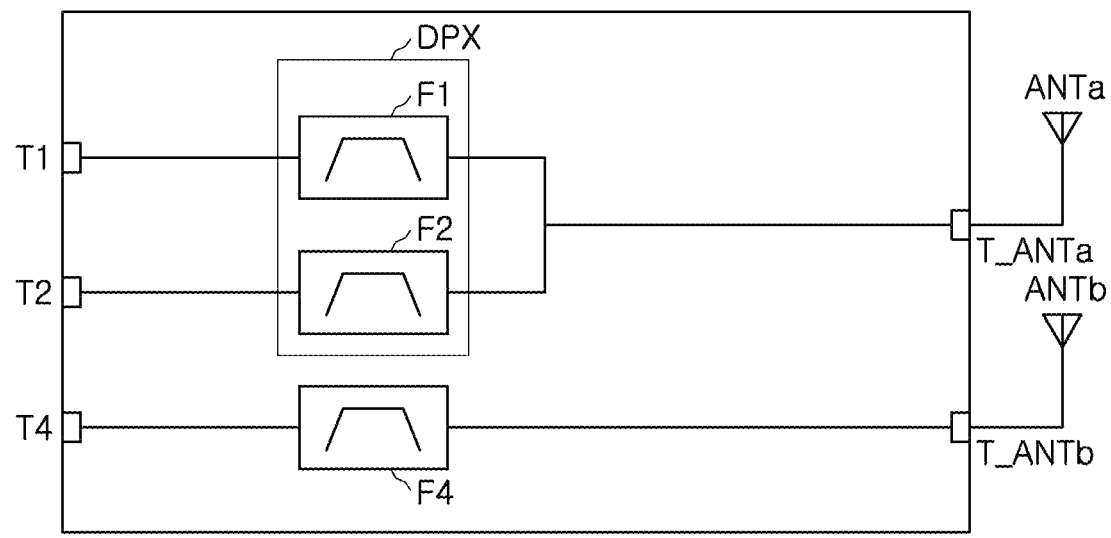
Figure 7:
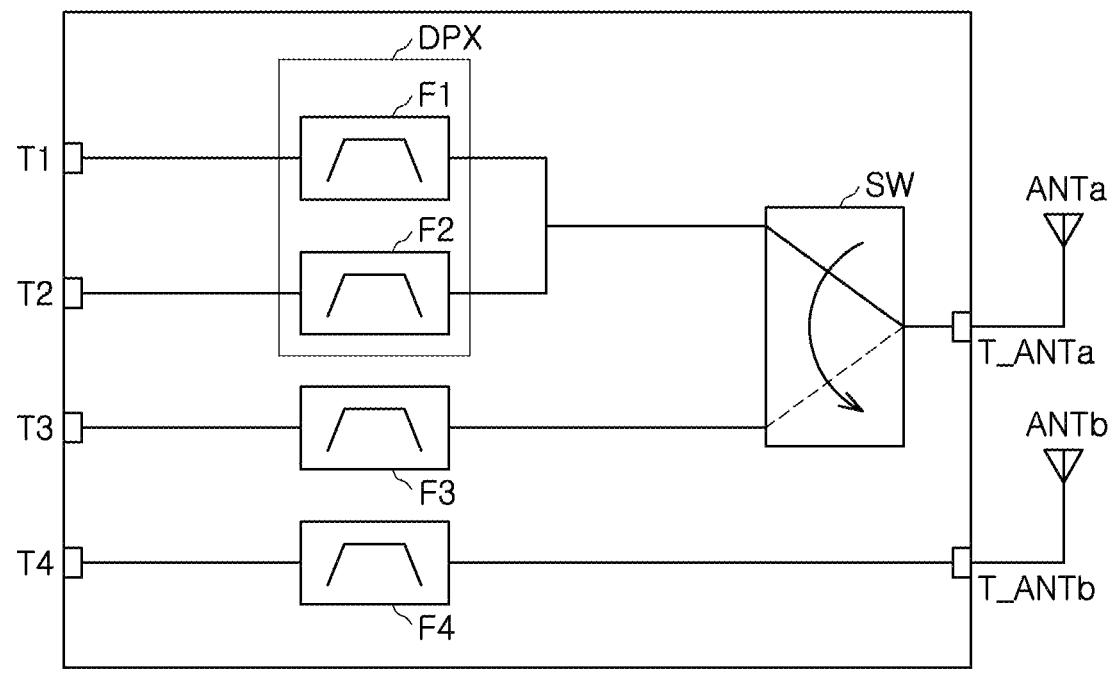

FIGS. 5 to 7 are block diagrams of frontend modules according to various examples.

Frontend modules according to the examples of FIGS. 5 to 7 may be similar to the frontend module according to an example of FIG. 2, such that a duplicated description is omitted for brevity, and example differences therebetween will be the focus of the description.

Referring to the example of FIG. 5, a frontend module according to an example of FIG. 5 may further include a third filter F3 and a switch SW, as compared with the frontend module according to an example of FIG. 2. The third filter F3 may be disposed between the switch SW and a third terminal T3. In such an example, one end of the third filter F3 may be connected to the switch SW, and the other end of the third filter F3 may be connected to the third terminal T3.

The third filter F3 may support cellular communications in a predetermined second frequency band from among the sub-6 GHz band. For example, the third filter F3 may support cellular communications in the 4.4 GHz to 5.0 GHz band (the n79 band), corresponding to the second frequency band.

The third filter F3 may operate as a band-pass filter. For example, the third filter F3 may include a band-pass filter having a passband of the 4.4 GHz to 5.0 GHz band. Such a filter may have a lower limit frequency of 4.4 GHz and an upper limit frequency of 5.0 GHz.

For example, the switch SW may be implemented using a three-terminal switch in a form of a single pole double throw (SPDT). One end of the switch SW may be connected to the first antenna terminal T_ANTa, and the other end of the switch SW may be selectively connected to the duplexer DPX and the third filter F3. In such an example, the switch SW may selectively connect the duplexer DPX and the third filter F3 to the first antenna terminal T_ANTa.

Because a band gap in the 4.4 GHz to 5.0 GHz band corresponding to the passband of the third filter F3, the 3.3 GHz to 4.2 GHz band corresponding to the passband of the first filter F1, and the 5.15 GHz to 5.95 GHz band corresponding to the passband of the second filter F2 are each extremely narrow, it is possible to transmit and receive RF signals through a single first antenna ANTa in a time-division manner via use of the switch SW. Therefore, operating time periods of the first filter F1 and the second filter F2, and an operating time period of the third filter F3 may be different from each other.

The frontend module according to this example may perform cellular communications of the n79 band (4.4 GHz to 5.0 GHz) among the sub-6 GHz band, in addition to cellular communications of the n79 band (3.3 GHz to 4.2 GHz) and Wi-Fi communications in the 5 GHz band among the sub-6 GHz band.

Referring to the example of FIG. 6, a frontend module according to an example of FIG. 6 may further include a fourth filter F4, as compared with the frontend module according to an example of FIG. 2.

The fourth filter F4 may be disposed between a second antenna terminal T_ANTb and a fourth terminal T4. For example, one end of the fourth filter F4 may be connected to the second antenna terminal T_ANTb, and the other end of the fourth filter F4 may be connected to the fourth terminal T4.

The fourth filter F4 may support Wi-Fi communications in the 2.4 GHz band. For example, the fourth filter F4 may support Wi-Fi communications in the 2.4 GHz to 2.4835 GHz band.

The fourth filter F4 may operate as a band-pass filter. For example, the fourth filter F4 may include a band-pass filter having a passband of the 2.4 GHz to 2.4835 GHz band. Such a band-pass filter may have a lower limit frequency of 2.4 GHz and an upper limit frequency of 2.4835 GHz.

The frontend module according to this example may perform Wi-Fi communications in the 2.4 GHz band, in addition to cellular communications in the n77 band (3.3 GHz to 4.2 GHz) and Wi-Fi communications in the 5 GHz band among the sub-6 GHz band.

Referring to the example of FIG. 7, a frontend module according to an example of FIG. 7 may include a third filter F3, a fourth filter F4, and a switch SW, in addition to the frontend module according to an example of FIG. 2. Because the third filter F3, the fourth filter F4, and the switch SW in the example of FIG. 7 are the same as the third filter F3 and the switch SW in FIG. 5, and the fourth filter F4 in the example of FIG. 6, a detailed description thereof is omitted for brevity.

The frontend module according to this example may perform cellular communications in the n79 band (4.4 GHz to 5.0 GHz) and Wi-Fi communications in the 2.4 GHz band among the sub-6 GHz band, in addition to cellular communications in the n79 band (3.3 GHz to 4.2 GHz) and Wi-Fi communications in the 5 GHz band among the sub-6 GHz band.

Figure 8:
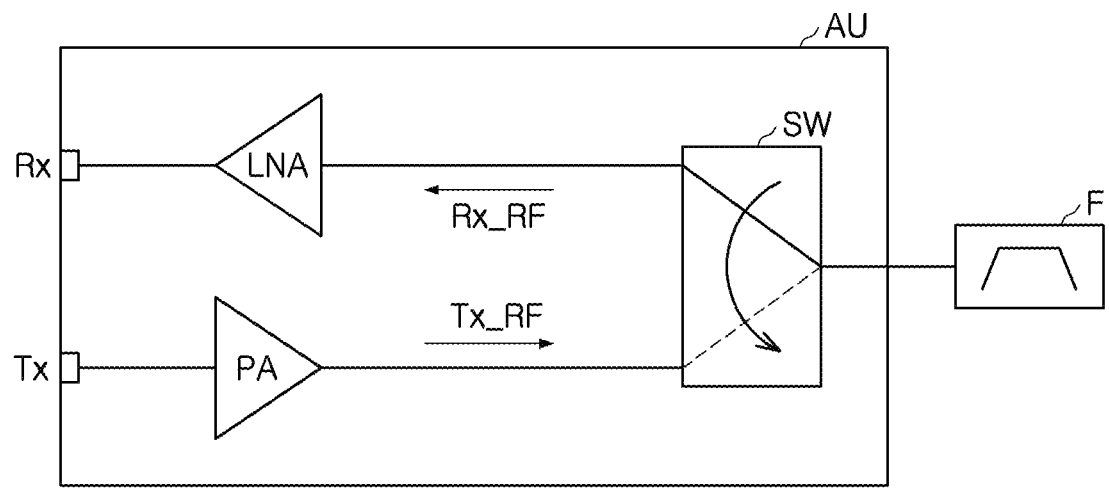
FIG. 8 is a block diagram illustrating an example of an amplifier connected to a filter according to an example.

FIG. 8 is a block diagram illustrating an example of an amplifier connected to a filter according to an example.

In the example of FIG. 8, it may be understood that a filter F may correspond to any one of the first filter F1, the second filter F2, the third filter F3, and the fourth filter F4 as per the examples of FIGS. 2, 5, 6, and 7. It may also be understood that a receiving terminal Rx and a transmitting terminal Tx may be included in any one of the first terminal T1 to the fourth terminal T4 as per the examples of FIGS. 2, 5, 6, and 7. For example, in the example of FIG. 8, the first terminal T1 may include the receiving terminal Rx and the transmitting terminal Tx.

An amplifying unit AU may include a switch SW, a low noise amplifier LNA, and a power amplifier PA.

Referring to the example of FIG. 8, the filter F may be connected to one end of the low noise amplifier LNA and one end of the power amplifier PA through the switch SW. In such an example, the low noise amplifier LNA may be disposed in a receiving path (Rx_RF) of an RF signal, and the power amplifier PA may be disposed in a transmission path (Tx_RF) of the RF signal. The other end of the low noise amplifier LNA may be connected to the receiving terminal Rx, and the other end of the power amplifier PA may be connected to the transmitting terminal Tx.

In the example of FIG. 8, an example is illustrated in which the low noise amplifier LNA is disposed in the receiving path Rx_RF, and the power amplifier PA is disposed in the transmission path Tx_RF. Depending on the possible requirements for amplification according to the design aspects, the low noise amplifier LNA may be removed from the receiving path Rx_RF, or the power amplifier PA may be removed from the transmission path Tx_RF, in other examples.

According to an example, the number of antennas employed in a mobile device may be reduced to improve the isolation characteristic of the antenna.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A frontend module comprising:
    an antenna terminal; and
    a duplexer comprising:
        a first filter, connected to the antenna terminal and a first terminal, configured to perform cellular communications within a 3.3 GHz to 4.2 GHz band, the first filter comprising series connected components connected between the antenna terminal and the first terminal in series, and shunt connected components, each disposed between a ground and a node of different nodes between the antenna terminal and the first terminal; and
        a second filter, connected to the antenna terminal and a second terminal, configured to perform Wi-Fi communications within a 5.15 GHz to 5.950 GHz band,
    wherein each of the first filter and the second filter comprises an LC filter, and a portion of an operating time period of the first filter overlaps a portion of an operating time period of the second filter, and
    each of plural shunt connected components of the shunt connected components comprises a capacitor and an inductor connected to each other in series.

2. The frontend module of claim 1, further comprising an impedance matching component configured to match an impedance of a passband of the first filter and an impedance of a passband of the second filter.

3. The frontend module of claim 2, wherein the impedance matching component comprises a matching inductor disposed between the antenna terminal and a ground.

4. The frontend module of claim 1, further comprising a fourth filter having a passband of a 2.4 GHz to 2.4835 GHz band,
    wherein the fourth filter is connected to an antenna terminal that is different from the antenna terminal to which the duplexer is connected.

5. The frontend module of claim 1, wherein one series connected component from among the series connected components comprises a capacitor and an inductor connected to each other in parallel, configured to form an attenuation pole at 5.90 GHz to 6.0 GHz, and
    another series connected component from among the series connected components comprises a capacitor and an inductor connected to each other in parallel, configured to form an attenuation pole at 2.25 GHz to 2.35 GHz.

6. The frontend module of claim 5, wherein the one series connected component from among the series connected components is configured to form an attenuation pole at 5.95 GHz, and the other series connected component from among the series connected components is configured to form an attenuation pole at 2.3 GHz.

7. The frontend module of claim 1, wherein a first shunt connected component from among the shunt connected components comprises a capacitor and an inductor connected to each other in series, configured to form an attenuation pole at 1.95 GHz to 2.05 GHz,
    a second shunt connected component from among the shunt connected components comprises a capacitor and an inductor connected to each other in series, configured to form an attenuation pole at 2.64 GHz to 2.74 GHz, and
    a third shunt connected component from among the shunt connected components comprises a capacitor and an inductor connected to each other in series, configured to form an attenuation pole at 5.10 GHz to 5.20 GHz.

8. The frontend module of claim 7, wherein the first shunt connected component is configured to form an attenuation pole at 2 GHz,
the second shunt connected component is configured to form an attenuation pole at 2.69 GHz, and
the third shunt connected component is configured to form an attenuation pole at 5.15 GHz.

9. The frontend module of claim 1, wherein the second filter comprises series connected components connected between the antenna terminal and the second terminal in series, and shunt connected components, each disposed between a ground and a node of different nodes between the antenna terminal and the second terminal.

10. The frontend module of claim 9, wherein one shunt connected component from among the shunt connected components comprises a capacitor and an inductor connected to each other in series, and is configured to form an attenuation pole at 4.15 GHz to 4.25 GHz, and
another shunt connected component from among the shunt connected components comprises a capacitor and an inductor connected to each other in series, and is configured to form an attenuation pole at 3.70 GHz to 3.80 GHz.

11. The frontend module of claim 10, wherein the one shunt connected component is configured to form an attenuation pole at 4.20 GHz, and the other shunt connected component is configured to form an attenuation pole at 3.75 GHz.

12. The frontend module of claim 1, further comprising a third filter having a passband of a 4.4 GHz to 5.0 GHz band; and
a switch configured to selectively connect the duplexer and the third filter to the antenna terminal.

13. A frontend module comprising:
an antenna terminal; and
a duplexer comprising,
a first filter, connected to the antenna terminal, comprising series connected components connected between the antenna terminal and the tint terminal in series, and shunt connected components, each disposed between a ground and a node of different nodes between the antenna terminal and the first terminal; and
a second filter configured to perform radio communications of a standard different from a standard supported by the first filter in a frequency band different from a frequency band of the first filter,
wherein each of the first filter and the second filter comprises an LC filter, and a portion of an operating time period of the first filter overlaps a portion of an operating time period of the second filter, and
each of plural shunt connected components of the shunt connected components comprises a capacitor and an inductor connected to each other in series.

14. The frontend module of claim 13, wherein the first filter and the second filter each have an attenuation characteristic of 35 dB or more.

15. The frontend module of claim 13, wherein the first filter is configured to support cellular communications within a 3.3 GHz to 4.2 GHz band, and the second filter is configured to support Wi-Fi communications within a 5.15 GHz to 5.950 GHz band.

16. A frontend module comprising:
an antenna terminal; and
a duplexer comprising:
a first filter, connected to the antenna terminal and a first terminal, configured to perform cellular communications, the first filter comprising series connected components connected between the antenna terminal and the first terminal in series, and shunt connected components, each disposed between a ground and a node of different nodes between the antenna terminal and the first terminal; and
a second filter connected to the antenna terminal and a second terminal, configured to perform Wi-Fi communications,
wherein each of the first filter and the second filter comprises an LC filter, and a portion of an operating time period of the first filter overlaps a portion of an operating time period of the second filter, and
each of plural shunt connected components of the shunt connected components comprises a capacitor and an inductor connected to each other in series.

17. The frontend module of claim 16, further comprising an impedance matching component configured to match an impedance of a passband of the first filter and an impedance of a passband of the second filter.

18. The frontend module of claim 16, wherein the first filter is configured to support the cellular communications within a 3.3 GHz to 4.2 GHz band, and the second filter is configured to support the Wi-Fi communications within a 5.15 GHz to 5.950 GHz band.

19. The frontend module of claim 16, wherein the first filter and the second filter each have an attenuation characteristic of 35 dB or more.

* * * * *